United States Patent
Upputuri et al.

(10) Patent No.: US 9,299,394 B2
(45) Date of Patent: Mar. 29, 2016

(54) METHOD AND CIRCUIT FOR REDUCING CURRENT SURGE

(71) Applicant: BROADCOM CORPORATION, Irvine, CA (US)

(72) Inventors: Bharath Upputuri, San Jose, CA (US); Bruce Kauffmann, Santa Clara, CA (US); Ray Bloker, Los Gatos, CA (US)

(73) Assignee: Broadcom Corporation, Irvine, CA (US)

( * ) Notice: Subject to any disclaimer, the term of this patent is extended or adjusted under 35 U.S.C. 154(b) by 540 days.

(21) Appl. No.: 13/645,427

(22) Filed: Oct. 4, 2012

(65) Prior Publication Data

US 2014/0097702 A1    Apr. 10, 2014

(51) Int. Cl.
   *G11C 5/14*    (2006.01)
   *G11C 5/06*    (2006.01)

(52) U.S. Cl.
   CPC .............. *G11C 5/14* (2013.01); *G11C 5/063* (2013.01); *Y10T 307/76* (2015.04)

(58) Field of Classification Search
   CPC ........... H02M 3/156; H02M 3/00; G11C 5/14
   USPC ............................ 307/133; 200/308; 327/384
   See application file for complete search history.

(56) References Cited

U.S. PATENT DOCUMENTS

| 5,990,581 A * | 11/1999 | Ikegami | H02H 9/001 307/131 |
| 7,622,905 B2 * | 11/2009 | Huang | G05F 1/56 323/274 |
| 2008/0180157 A1 * | 7/2008 | Choi | G06F 1/26 327/384 |
| 2010/0219801 A1 * | 9/2010 | Yonezawa | H02M 3/156 323/282 |

OTHER PUBLICATIONS

F. Hamzaoglu, et al. A 3.8 GHz 153 Mb SRAM Design With Dynamic Stability Enhancement and Leakage Reduction in 45 nm High-k Metal Gate CMOS Technology: IEEE Journal of Solid State Circuits, vol. 44, No. 1, pp. 148-154, Jan. 2009.

* cited by examiner

*Primary Examiner* — Jared Fureman
*Assistant Examiner* — James P Evans
(74) *Attorney, Agent, or Firm* — McDermott Will & Emery LLP

(57) ABSTRACT

Systems and methods are provided for reducing surge current in power gated designs. In one aspect, a storage capacitor supplies a portion of the current used to power up a circuit. The storage capacitor may be charged from a power supply or other source. When the circuit is to be powered up, the circuit is connected to the power supply and the storage capacitor. As a result, current is supplied to the circuit from the power supply and the storage capacitor to power up the circuit. Because a portion of the current used to power up the circuit is supplied from the storage capacitor, the amount of current needed from the power supply to power up the circuit can be reduced, thereby reducing current surge through the power supply. The storage capacitor may be shared by multiple circuits.

10 Claims, 9 Drawing Sheets

METHOD AND CIRCUIT FOR REDUCING CURRENT SURGE

TECHNICAL FIELD

The present description relates generally to power gating, and more particularly, to power gating with reduced current surge.

BACKGROUND

Power gating may be used to reduce power leakage by a circuit in an electronic system, in which a power controller uses a switch to selectively connect the circuit to a power supply depending on whether the circuit is in operation. When the circuit is in operation, the power controller turns on the switch to connect the circuit to the power supply through the switch. When the circuit is turned off or in standby mode, the power controller turns off the switch to disconnect the circuit from the power supply. The circuit may comprise a memory, logic or another type of circuit. The switch may have a low resistance so that power dissipation across the switch is minimized when the circuit is connected to the power supply through the switch.

Power gating may cause a large current surge through the power supply when the switch is first turned on due to the low resistance of the switch and a large voltage difference between the power supply and the circuit when the switch is first turned on. The current surge may create a large IR voltage drop in the power supply because of power grid resistance and/or package inductance. This drop may cause other circuits connected to the power supply to lose their state, thus causing functionality failure.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

Figure 1:
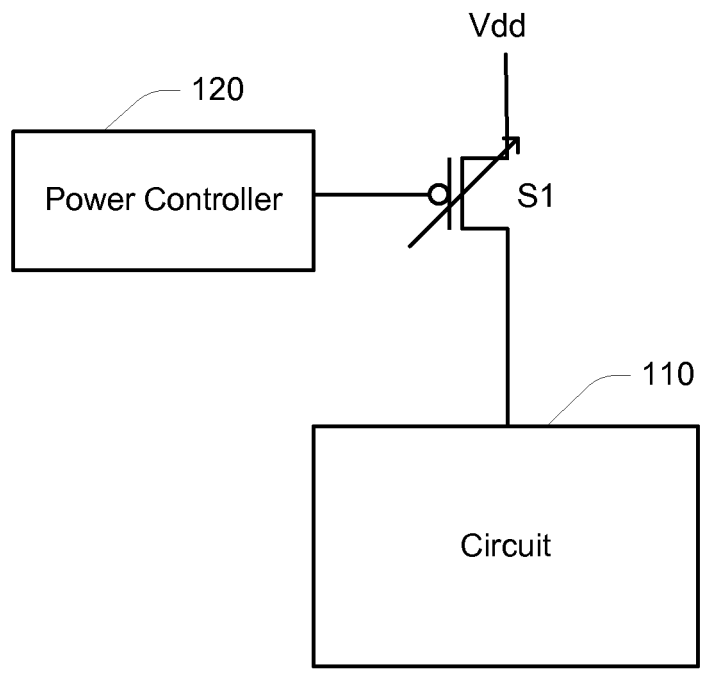
FIG. 1 illustrates an example of a variable-resistance switch for selectively connecting a circuit to a power supply.

FIG. 1 illustrates an approach for preventing a large current surge in power-gated designs, in which a switch S1 with a variable resistance is used to selectively connect a circuit 110 to a power supply having a voltage of Vdd. A power controller 120 controls switching of switch S1 to manage power to the circuit 110. The power controller 120 also adjusts the resistance of switch S1 between a low resistance and a high resistance to prevent a large current surge.

When the power controller 120 first turns on switch S1 (e.g., to wake up the circuit 110), the power controller 120 sets switch S1 to the high resistance to limit the current flow to the circuit 110 through switch S1, thereby preventing a large current surge through the power supply. When the voltage of the circuit 110 reaches a certain level, the power controller 120 sets switch S1 to the low resistance to finish powering up the circuit 110 to the power supply voltage Vdd and minimize power dissipation across switch S1.

Figure 2:
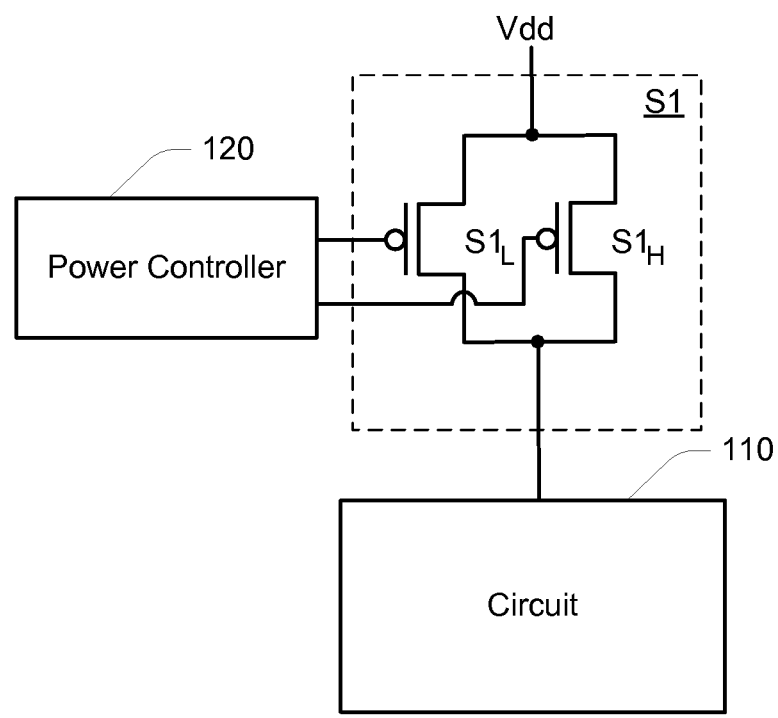
FIG. 2 illustrates an example implementation of the variable-resistance switch.

To provide variable resistance, switch S1 may be implemented using two or more switches with different resistances, an example of which is shown in FIG. 2. In this example, switch S1 includes a low-resistance switch $S1_L$ and a high-resistance switch $S1_H$. The high-resistance switch $S1_H$ may have a resistance that is one or more orders of magnitude higher than the resistance of the low-resistance switch $S1_L$. Each switch may be implemented using a p-channel field-effect transistor (as shown in FIG. 2), in which the switches may be given different resistances by fabricating the corresponding transistors with different gate widths. In this example, the transistor implementing the low-resistance switch $S1_L$ has a wider gate (and hence lower resistance) than the transistor implementing the high-resistance switch $S1_H$.

For the implementation in FIG. 2, when the power controller 120 first turns on switch S1, the power controller 120 may set the resistance of switch S1 to the high resistance by turning on the high-resistance switch $S1_H$ with the low-resistance switch $S1_L$ turned off. When the voltage of the circuit 110 reaches a certain level, the power controller 120 may reduce the resistance of the switch S1 to the low resistance by turning on the low-resistance switch $S1_L$. When the low-resistance switch $S1_L$ is turned on, the high-resistance switch $S1_H$ may be left on or turned off.

Thus, the power controller 120 prevents a large current surge through the power supply by initially setting switch S1 to the high resistance. The high resistance limits the amount of current drawn from the power supply to the circuit 110 through switch S1, thereby preventing a large current surge. However, limiting the current flow to the circuit 110 may cause a delay in powering up the circuit 110 to Vdd. For example, when the circuit includes a memory, the delay may increase the wait time for accessing the memory, causing a bottleneck in performance.

Figure 3:
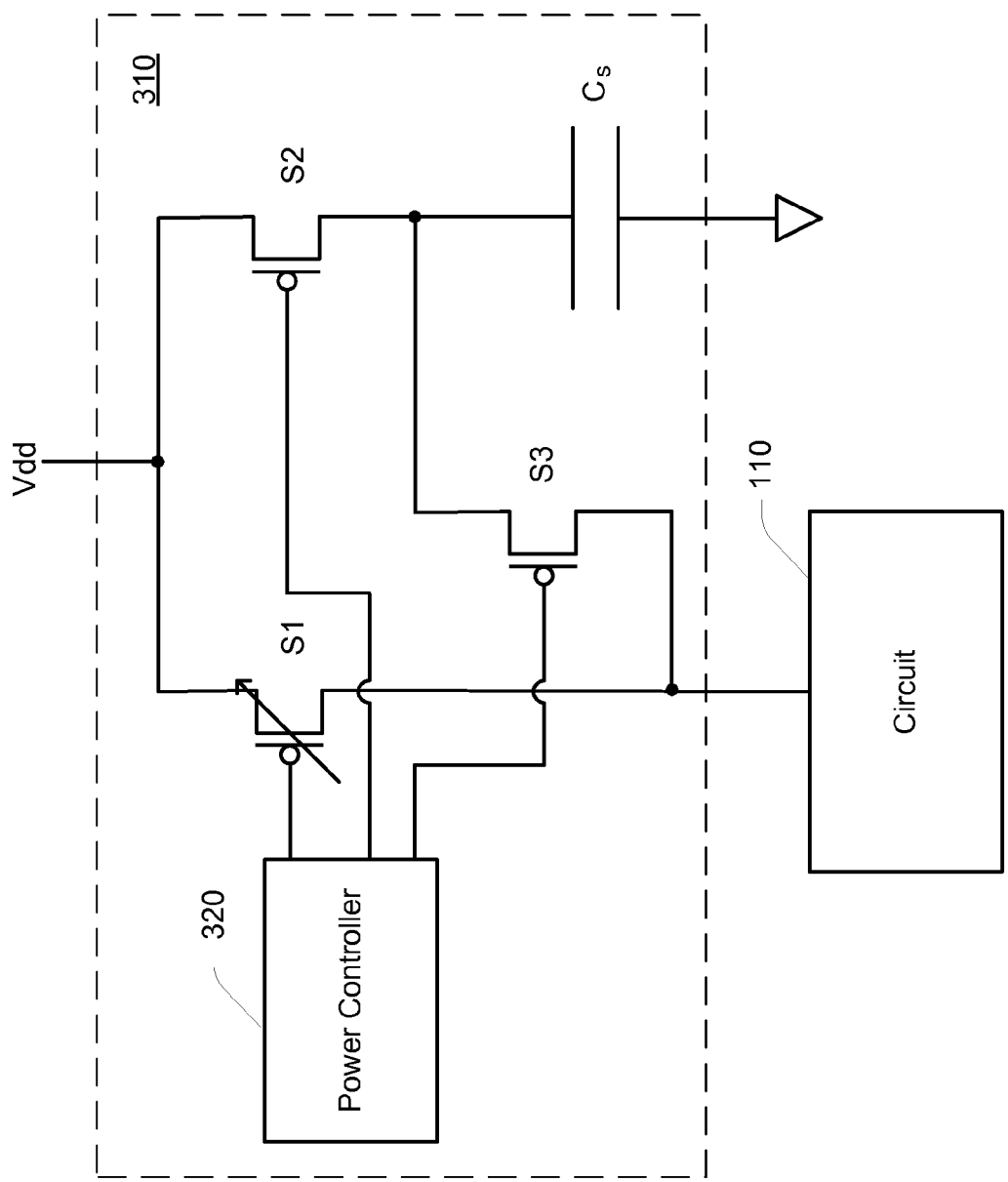
FIG. 3 illustrates an example power system including a storage capacitor according to aspects of the subject technology.

FIG. 3 shows an example power system 310 according to some aspects of the subject technology. The power system 310 includes switches S2 and S3, a storage capacitor $C_S$, and a power controller 320. The power system 310 can be used to reduce the latency associated with the approach in FIG. 1 by using the storage capacitor $C_S$ to provide additional current for powering up the circuit 110.

When the circuit 110 is turned off or in standby mode, the power controller 320 charges up the storage capacitor $C_S$ to Vdd by turning on switch S2 while leaving switch S3 turned off. This allows current to flow from the power supply to the storage capacitor $C_S$ to charge the storage capacitor $C_S$ to Vdd while keeping the storage capacitor $C_S$ isolated from the circuit 110. The power controller 320 may also charge up the storage capacitor $C_S$ when the circuit 110 is in normal operation, assuming that the amount of current drawn from the power supply to charge the storage capacitor $C_S$ is not enough to disrupt the normal operation of the circuit 110.

When the circuit 110 is to be powered up to Vdd (e.g., woken up), the power controller 320 may turn off switch S2 to disconnect the storage capacitor $C_S$ from the power supply and turn on switch S3 to connect the storage capacitor $C_S$ to the circuit 110 through switch S3. As a result, the storage capacitor $C_S$ discharges to the circuit 110 through switch S3, thereby supplying current to the circuit 110.

The power controller 320 may also turn on switch S1 in the high-resistance state to supply current to the circuit 110 from the power supply. Thus, current may be supplied to the circuit 110 from both the power supply through switch S1 and the storage capacitor $C_S$ through switch S3.

When the voltage of the circuit 110 reaches a certain level, the power controller 320 may reduce the resistance of switch S1 to the low resistance to finish powering up the circuit 110 to Vdd. At about this time, the power controller 320 may turn off switch S3 to disconnect the circuit 110 from the storage capacitor $C_S$.

After the circuit 110 is powered up to Vdd, the circuit 110 may begin normal operation. For the example where the circuit 110 includes a memory, the memory may be capable of performing read/write operations when the memory voltage is approximately Vdd. During normal operation of the circuit 110, the power controller 320 leaves switch S1 turned on in the low-resistance state to supply power to the circuit 110 from the power supply.

Thus, the storage capacitor $C_S$ supplies additional current for waking up the circuit 110. The additional current can be used to reduce the wakeup time for the circuit 110 without increasing the current surge through the power supply. This is because the additional current from the storage capacitor $C_S$ increases the total amount of current available to power up the circuit 110 without having to draw more current from the power supply through switch S1. Therefore, for a given current surge through the power supply, the storage capacitor $C_S$ can significantly reduce the wakeup time for the circuit 110 compared with the approach in FIG. 1.

The additional current from the storage capacitor $C_S$ can also be used to reduce the current surge through the power supply without increasing the wakeup time. This is because, when the current flow through switch S1 is reduced to reduce the current surge, the additional current from the storage capacitor $C_S$ can be used to make up the difference to achieve the same wakeup time.

The additional current from the storage capacitor $C_S$ can also be used to achieve both a reduction in wakeup time and a reduction in current surge. For example, the current flow through switch S1 may be reduced to reduce the current surge through the power supply (e.g., by increasing the resistance of switch S1). At the same time, the storage capacitor $C_S$ may have a capacitance with enough charge-storage capacity to supply a current that is larger than the current reduction through switch S1, thereby achieving reductions in both wakeup time and current surge.

In some aspects, during normal operation of the circuit 110, the power controller 320 may turn on switch S2 with switch S3 turned off to charge up the storage capacitor $C_S$ to Vdd. The charge-up time for the storage capacitor $C_S$ may be relatively slow compared with the time to power up the circuit 110. This is because the storage capacitor $C_S$ may not be needed to supply current to the circuit 110 until the next wakeup cycle. Thus, switch S2 may have a relatively high resistance (compared with the low resistance of switch S1) when turned on so that only a small amount of current is drawn from the power supply to charge up the storage capacitor $C_S$. Switch S3, on the other hand, may have a relatively low resistance (e.g., comparable to the low resistance of switch S1) when turned on to allow large current flow from the storage capacitor $C_S$ to the circuit 110 to quickly power up the circuit 110.

The power controller 320 may leave switch S2 turned on until the next wakeup cycle. Leaving switch S2 turned on allows the power supply to maintain the charge of the storage capacitor $C_S$ at Vdd when the storage capacitor $C_S$ is leaky.

When the circuit 110 is to be turned off or placed in standby mode, the power controller 320 may turn off switch S1 to disconnect the circuit 110 from the power supply. In standby, the voltage of the circuit 110 may be reduced to a voltage level below the power supply Vdd to reduce power leakage. The lower voltage in standby may be provided by a circuit (not shown) that converts the power supply voltage Vdd to the lower voltage or may be provided by a separate power supply (not shown).

As discussed above, the power controller 320 may turn on switch S2 during normal operation of the circuit 110 to charge up the storage capacitor $C_S$. Alternatively, the power controller 320 may turn off switch S2 during normal operation of the circuit 110 and wait until the circuit is turned off or in standby mode to turn on switch S2 to charge up the storage capacitor $C_S$.

As discussed above, during power up, the power controller 320 may adjust the resistance of switch S1 from the high resistance to the low resistance when the voltage of the circuit 110 reaches a certain voltage level. This voltage level may be determined based on a voltage level at which the current flow through switch S1 at the low resistance is within a current limit. The current limit may be defined by a specification for the power supply (e.g., based on the maximum IR drop that can be tolerated in the power supply without causing functionality failure in other circuits connected to the power supply). The current flow through switch S1 at the low resistance may be given approximately by:

$$I = \frac{Vdd - Vc}{R} \qquad (1)$$

where I is the current through switch S1, R is the low resistance, and Vc is the voltage of the circuit 110. As shown in Eq. (1), the current I through switch S1 at the low resistance decreases as the voltage of the circuit 110 approaches the power supply voltage Vdd. Thus, given a current limit for the current I through switch S1, a voltage level may be determined at which the resistance of switch S1 can be reduced while staying within the current limit.

In some aspects, a time delay may be determined between the time that switch S1 is first turned on in the high-resistance state and the time that the resistance of switch S1 is reduced from the high resistance to the low resistance. The time delay may be based on the time it takes the voltage Vc of the circuit 110 to reach a voltage level at which the current I through switch S1 at the low resistance is within the current limit. This time may be determined by performing circuit simulations, testing and/or calculations. Once determined, the power controller 320 may be programmed with the time delay.

In this example, when the circuit 110 is to be woken up, the power controller 320 may first turn on switch S1 in the high-resistance state to supply current to the circuit 110 from the power supply, and turn on switch S3 to supply additional current to the circuit 110 from the storage capacitor $C_S$. After the programmed time delay, the power controller 320 may reduce the resistance of switch S1 from the high resistance to the low resistance to finish powering up the circuit to Vdd. At about this time, the power controller 320 may turn off switch S3 to allow the storage capacitor $C_S$ to be charged up for the next wakeup cycle.

Alternately, the power controller 320 includes a voltage sensor configured to sense the voltage Vc of the circuit 110. When the sensed voltage reaches a certain voltage, the power controller 320 may reduce the resistance of switch S1 from the high resistance to the low resistance to finish powering up the circuit 110 to Vdd.

Figure 4:
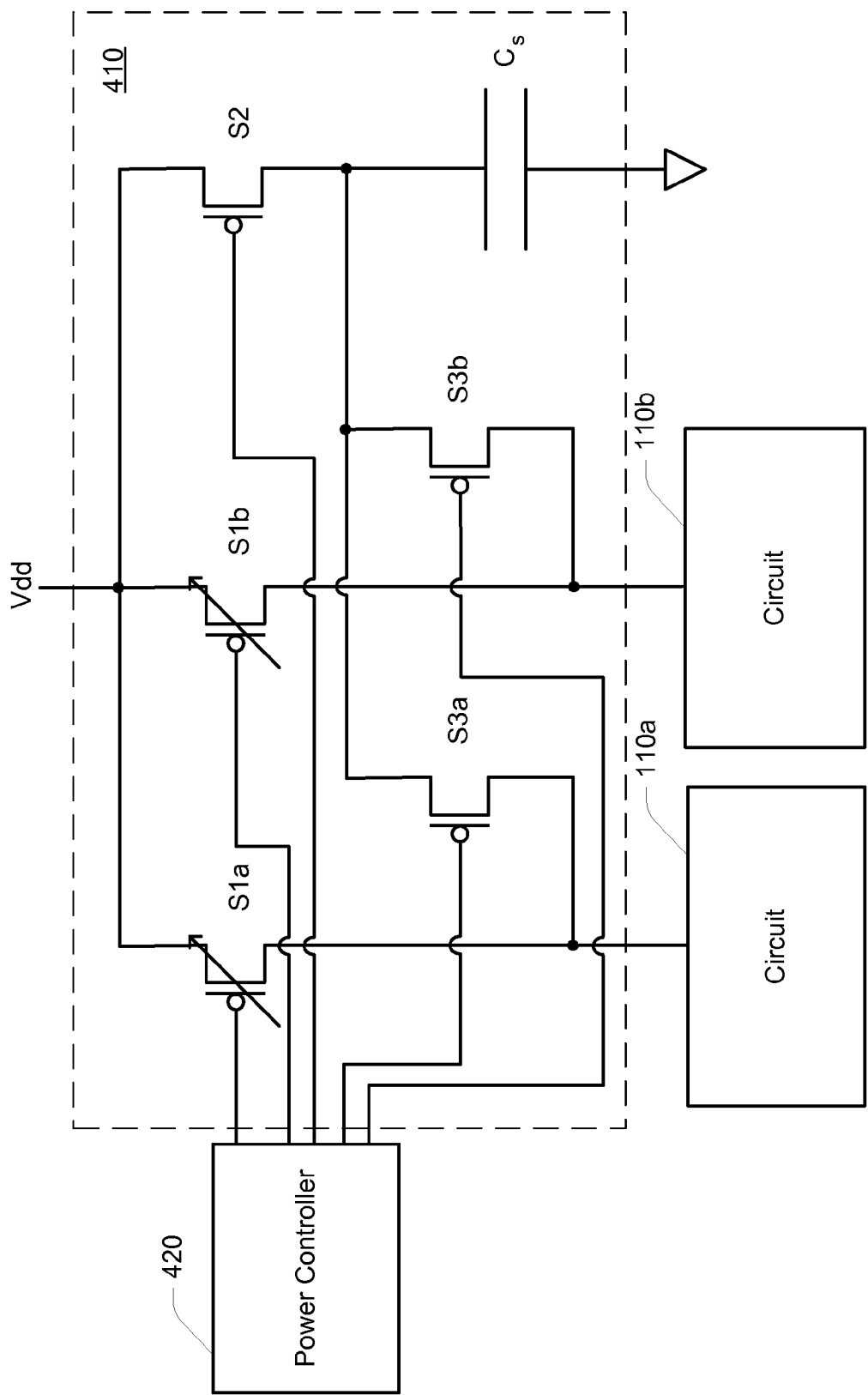
FIG. 4 illustrates an example power system including a storage capacitor that is shared by circuits according to aspects of the subject technology.

FIG. 4 shows an example power system 410 according to some aspects of the subject technology. The power system 410 is capable of managing power for two circuits 110a and 110b sharing a power supply. The circuits 110a and 110b may be integrated on the same chip or may be on separate chips.

The power system 410 includes switches S1a and S1b for selectively connecting the circuits 110a and 110b, respectively, to the power supply. Each of these switches may be a variable-resistance switch, as shown in FIG. 4. The power system 410 also includes a power controller 420, and a storage capacitor $C_S$ that is shared between the circuits 110a and 110b, as discussed further below. The power system 410 further includes switch S2 for selectively connecting the storage capacitor $C_S$ to the power supply, and switches S3a and S3b for selectively connecting the circuits 110a and 110b, respectively, to the storage capacitor $C_S$.

The power controller 420 may independently control switches S1a and S1b, allowing the power system 410 to independently control power to the circuits 110a and 110b. For example, if both circuits 110a and 110b are in normal operation, then the power controller 420 may turn on both switches S1a and S1b so that both circuits 110a and 110b are connected to the power supply. If one of the circuits 110a and 110b is in normal operation while the other circuit is turned off or in standby, then the power controller 420 may turn on the switch for the circuit that is in operation, and turn off the switch for the circuit that is turned off or in standby. If both circuits 110a and 110b are turned off or in standby mode, then the power controller 420 may turn off both switches S1a and S1b, in which case both circuits 110a and 110b are disconnected from the power supply.

The power controller 420 may charge up the storage capacitor $C_S$ to the power supply Vdd by turning on switch S2. The power controller 420 may do this when both circuits 110a and 110b are in normal operation, when one of the circuits 110a and 110b is in normal operation and the other circuit is turned off or in standby, and/or when both circuits 110a and 110b are turned off or in standby.

When circuit 110a is to be woken up, the power controller 420 may turn off switch S2, and turn on switch S3a while leaving switch S3b turned off. This creates a current path from the storage capacitor $C_S$ to circuit 110a, allowing the storage capacitor $C_S$ to supply current to circuit 110a through switch S3a. The power controller 420 may also turn on switch S1a in the high-resistance state to supply current to circuit 110a from the power supply. When the voltage of circuit 110a reaches a certain voltage level, the power controller 420 may reduce the resistance of switch S1a to the low resistance to finish powering up circuit 110a to Vdd. At about this time, the power controller 420 may turn off switch S3a to allow the storage capacitor $C_S$ to be charged up for the next wakeup cycle.

When circuit 110b is to be woken up, the power controller 420 may turn off switch S2, and turn on switch S3b while leaving switch S3a turned off. This creates a current path from the storage capacitor $C_S$ to circuit 110b, allowing the storage capacitor $C_S$ to supply current to circuit 110b through switch S3b. The power controller 420 may also turn on switch S1b in the high-resistance state to supply current to circuit 110b from the power supply. When the voltage of circuit 110b reaches a certain voltage level, the power controller 420 may reduce the resistance of switch S1b to the low resistance to finish powering up circuit 110b to Vdd. At about this time, the power controller 420 may turn off switch S3b to allow the storage capacitor $C_S$ to be charged up for the next wakeup cycle.

Thus, the power controller 420 may independently control switches S3a and S3b to direct current from the storage capacitor $C_S$ to the circuit being woken up. This allows each circuit 110a and 110b to use the storage capacitor $C_S$ when needed to wake up. Because circuits 110a and 110b share the storage capacitor $C_S$, two separate storage capacitors are not needed to wake up circuits 110a and 110b, thereby reducing the chip area needed for the power system 310.

Figure 5:
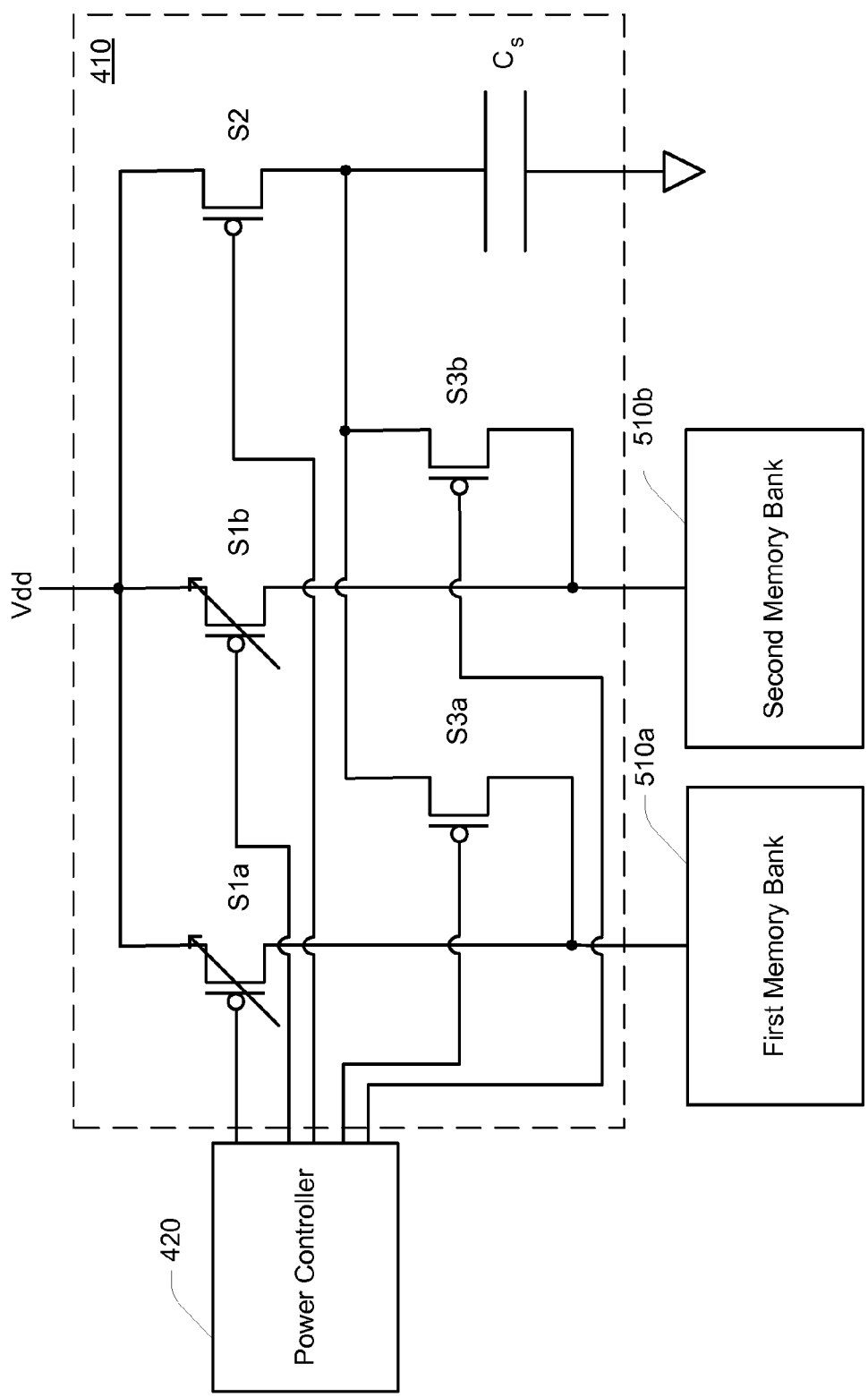
FIG. 5 illustrates an example power system including a storage capacitor that is shared by memory banks according to aspects of the subject technology.

FIG. 5 shows an example in which the circuit includes a first memory bank 510a and a second memory bank 510b. Each memory bank 510a and 510b may include static random access memory (SRAM) or other type of memory. The memory banks 510a and 510b may be integrated on the same chip. In addition, the memory banks 510a and 510b may be integrated on the same chip as other circuitry (e.g., one or more processors) to provide embedded memory. For example, the memory banks 510a and 510b may be integrated on the same chip as a processor to provide the processor with cache memory.

Each memory bank 510a and 510b may support read/write operations when the voltage of the memory bank is Vdd. Thus, the data in each memory bank 510a and 510 may be accessible (e.g., by a processor) when the voltage of the memory bank is Vdd.

When a memory bank 510a and 510b is not being accessed, the voltage of the memory bank may be reduced from Vdd to a "retention voltage" to conserve power. The retention voltage may be sufficient to retain the data in the memory bank, but insufficient to access the data in the memory bank (i.e., too low for read/write operations). For example, the retention voltage may be approximately 600 mV while Vdd may be approximately 900 mV. Reducing the voltage of the memory bank to the retention voltage when the memory bank is not being accessed reduces the leakage power of the memory bank, thereby conserving power. The retention voltage may be provided by a circuit (not shown) that converts the power supply voltage Vdd to the retention voltage or may be provided by a separate power supply (not shown).

In this example, the power controller 420 may independently manage power to the memory banks 510a and 510b. The power controller 410 may dynamically connect the first memory bank 510a to the power supply using switch S1a depending on whether the first memory bank 510a is currently being accessed. When the first memory bank 510a is being accessed (e.g., by a processor), the power controller 420 may turn on switch S1a, and, when the first memory bank 510a is not being accessed, the power controller 420 may turn off switch S1a.

The power controller 420 may dynamically connect the second memory bank 510b to the power supply using switch S1b depending on whether the second memory bank 510b is currently being accessed. When the second memory bank 510b is being accessed, the power controller 420 may turn on switch S1b, and, when the second memory bank 510b is not being accessed, the power controller 420 may turn off switch S1b.

When the first memory bank 510a is to be accessed, the power controller 420 may raise the voltage of the first memory bank 510a from the retention voltage to Vdd by supplying current from the storage capacitor $C_S$ to the first memory bank. The power controller 420 may do this by turning off switch S2 to disconnect the storage capacitor $C_S$ from the power supply, and turning on switch S3a with switch S3b turned off to direct current flow from the storage capacitor $C_S$ to the first memory bank 510a. The power controller 420 may also turn on switch S1a in the high-resistance state to supply current to the first memory bank 510a from the power supply. When the voltage of the first memory bank 510a reaches a certain voltage level, the power controller 420 may reduce the resistance of switch S1a to finish powering up the first memory bank 510a to Vdd. At about this time, the power controller 420 may turn off switch S3a to allow the storage capacitor $C_S$ to be charged up for the next wakeup cycle. When the first memory bank 510a is no longer being accessed, the power controller may turn off switch S1a to reduce power leakage.

When the second memory bank 510b is to be accessed, the power controller 420 may raise the voltage of the second memory bank 510b from the retention voltage to Vdd by supplying current from the storage capacitor $C_S$ to the second memory bank. The power controller 420 may do this by turning off switch S2 to disconnect the storage capacitor $C_S$ from the power supply, and turning on switch S3b with switch S3a turned off to direct current flow from the storage capacitor $C_S$ to the second memory bank 510b. The power controller 420 may also turn on switch S1b in the high-resistance state to supply current to the second memory bank 510b from the power supply. When the voltage of the second memory bank 510b reaches a certain voltage level, the power controller 420 may reduce the resistance of switch S1b to finish powering up the second memory bank 510b to Vdd. At about this time, the power controller 420 may turn off switch S3b to allow the storage capacitor $C_S$ to be charged up for the next wakeup cycle. When the second memory bank 510b is no longer being accessed, the power controller may turn off switch S1b to reduce power leakage.

In this example, access to the memory banks 510a and 510b may be controlled by a memory controller (not shown). When a processor needs access to a memory address corresponding to a particular memory bank, the memory controller may instruct the power controller 420 to wake up the memory bank. When the processor is finished accessing the memory bank, the memory controller may instruct the power controller 420 to place the memory bank back in standby, wherein the voltage of the memory bank is held at the retention voltage.

The capacitance of the storage capacitor $C_S$ may be chosen based on the capacitance of a memory bank, in which the capacitance of the memory bank may be approximated by a total capacitance from all of the memory cells in the memory bank. When the storage capacitor $C_S$ discharges to the memory bank, the storage capacitor is capable of raising the voltage of the memory bank to approximately:

$$V = \frac{Vr \cdot Cm + Vdd \cdot Cs}{Cm + Cs} \qquad (2)$$

where Vr is the retention voltage of the memory bank, Cm is the total capacitance of the memory bank, and Cs is the capacitance of the storage capacitor. Thus, for a given memory capacitance Cm and retention voltage Vr, Eq. (2) may be used to determine the capacitance of the storage capacitor $C_S$ needed to raise the voltage of the memory bank to a desired voltage level (e.g., voltage level at which the resistance of the switch S1a or S1b is to be reduced).

The memory banks 510a and 510b may share the storage capacitor $C_S$ with other circuitry. For example, the memory banks 510a and 510b may be integrated with other circuitry on the same chip to provide embedded memory.

Figure 6:
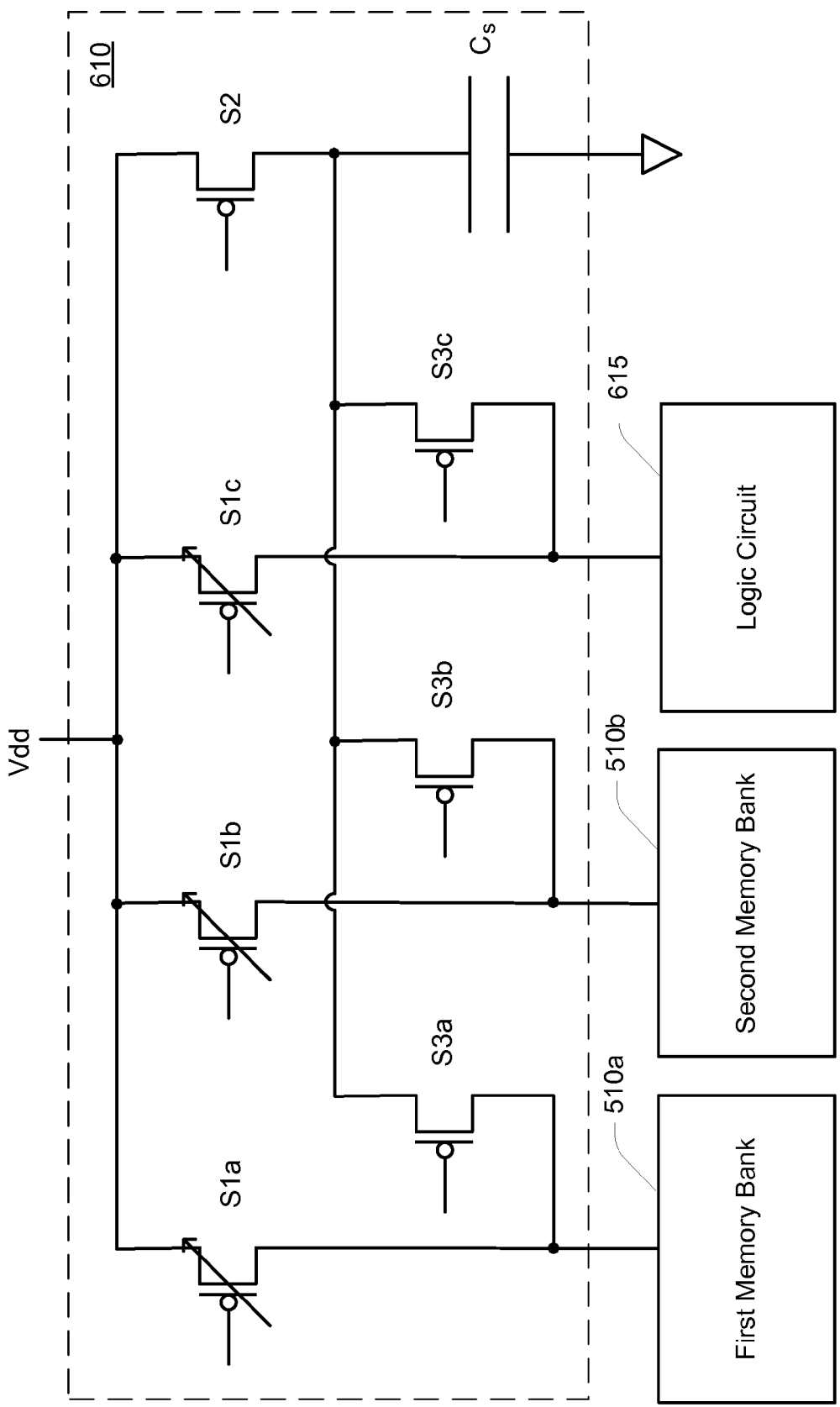
FIG. 6 illustrates an example power system including a storage capacitor that is shared by memory banks and logic according to aspects of the subject technology.

FIG. 6 illustrates an example power system 610 in which the storage capacitor $C_S$ is shared by the memory banks 510a and 510b and logic circuit 615, all of which may be integrated on the same chip. Logic circuit 615 may include a processor that uses the memory banks 510a and 510b for cache memory or other logic circuitry. In this example, the power system 610 further includes switch S1c to selectively connect logic circuit 615 to the power supply and switch S3c to selectively connect logic circuit 615 to the storage capacitor $C_S$. Switch S1c may be a variable-resistance switch. For ease of illustration, the connections between the power controller and the gates of the switches are not shown in FIG. 6.

When logic circuit 615 is turned off or in standby, the power controller (not shown in FIG. 6) may turn off switch S1c to disconnect logic circuit 615 from the power supply. When logic circuit 615 is to be woken up, the power controller may turn off switch S2 to disconnect the storage capacitor $C_S$ from the power supply, and turn on switch S3c with switches S3a and S3b turned off to direct current flow from the storage capacitor $C_S$ to logic circuit 615. The power controller may also turn on switch S1c in the high-resistance state to supply current to the logic circuit 615 from the power supply. When the voltage of logic circuit 615 reaches a certain voltage level, the power controller may reduce the resistance of switch S1c to finish powering up logic circuit 615 to Vdd. At about this time, the power controller may turn off switch S3c to allow the storage capacitor $C_S$ to be charged up for the next wakeup cycle. When logic circuit 615 is to be turned off or placed in standby, the power controller may turn off switch S1c.

In this example, the power controller may wake up the memory banks 510a and 510b in a similar manner as in the power system 410 shown in FIG. 5. To supply current from the storage capacitor $C_S$ to the first memory bank 510a, the power controller may turn on switch S3a while leaving switches S3b and S3c turned off. To supply current from the storage capacitor $C_S$ to the second memory bank 510b, the power controller may turn on switch S3b while leaving switches S3a and S3c turned off.

The storage capacitor $C_S$ is not limited to being shared by three circuits, and may be shared by a larger number of circuits. For each circuit sharing the storage capacitor $C_S$, the power system may include a separate power switch for selectively connecting the circuit to the power supply and a separate capacitor switch for selectively connecting the circuit to the storage capacitor $C_S$. When a particular circuit is to be woken up, the power controller may turn on the respective capacitor switch while leaving the capacitor switches for the other circuits turned off. This creates a current path between the storage capacitor $C_S$ and the circuit being woken up. The power controller may also turn on the respective power switch in the high-resistance state to supply current to the circuit from the power supply. When the voltage of the circuit reaches a certain voltage level, the power controller may reduce the resistance of the respective power switch to finish powering up the circuit to Vdd. When the circuit is to be turn off or placed in standby, the power controller may turn off the respective power switch.

The switch used to selectively connect the storage capacitor $C_S$ to the power supply may be turned on when none of the circuits are currently being woken up to charge up the storage capacitor $C_S$ to Vdd. When this switch is turned on, all of the capacitor switches may be turned off to isolate the storage capacitor $C_S$ from the circuits during charge up.

Figure 7:
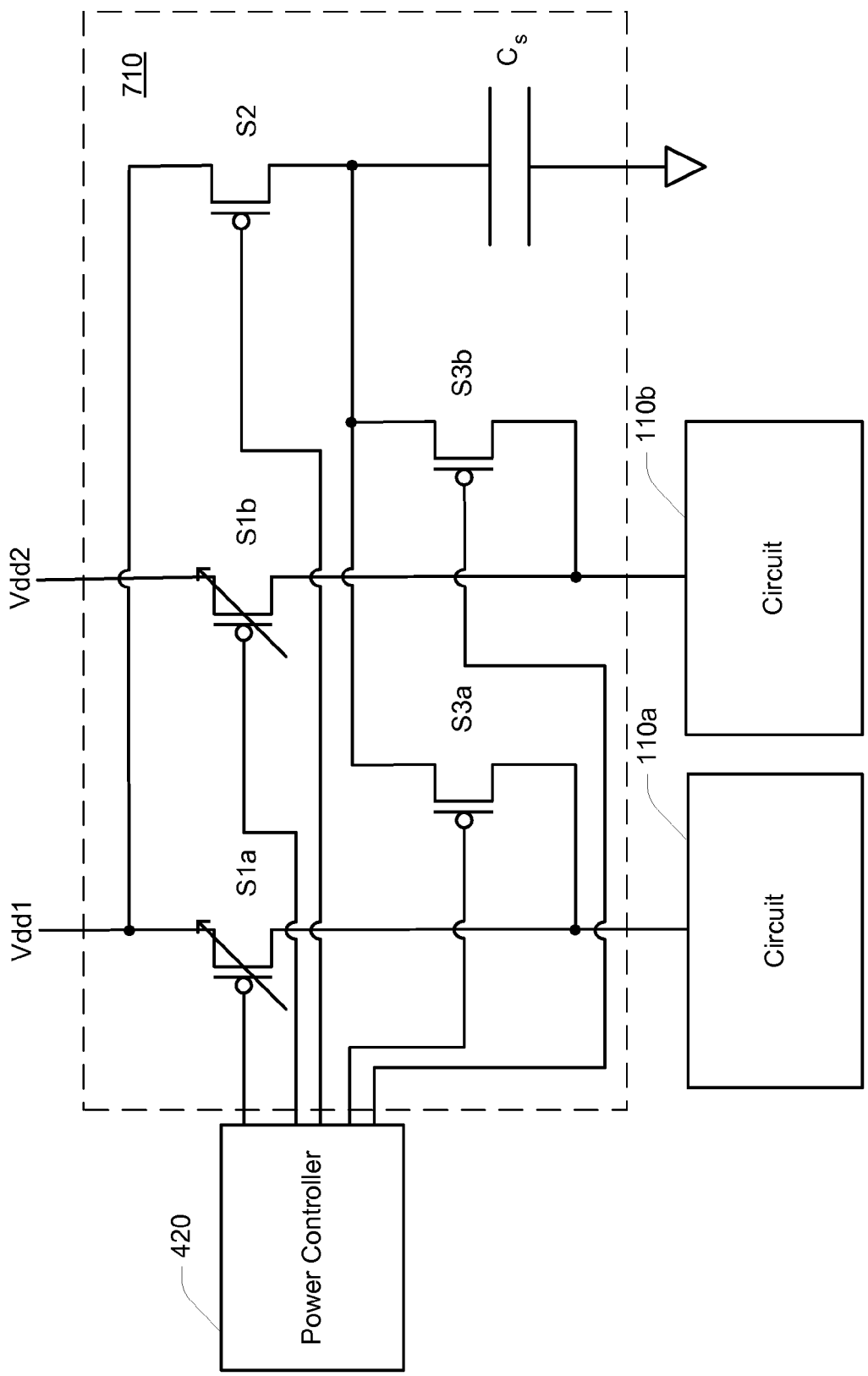
FIG. 7 illustrates an example power system in which circuits are powered by different power supplies according to aspects of the subject technology.

FIG. 7 illustrates an example power system 710 in which circuits 110a and 110b are selectively connected to different power supplies by switches S1a and S1b, respectively. Circuit 110a is selectively connected to a first power supply having a voltage of Vdd1, and circuit 110b is selectively connected to a second power supply having a voltage of Vdd2. Thus, circuits 110a and 110b may receive power at different power supply voltages (Vdd1 and Vdd2, respectively). The storage capacitor $C_S$ may be selectively connected to the first power supply by switch S2 to charge the storage capacitor $C_S$, as shown in the example in FIG. 7. Alternatively, the storage capacitor $C_S$ may be selectively connected to the second power supply by switch S2 to charge the storage capacitor $C_S$ (not shown).

Figure 8:
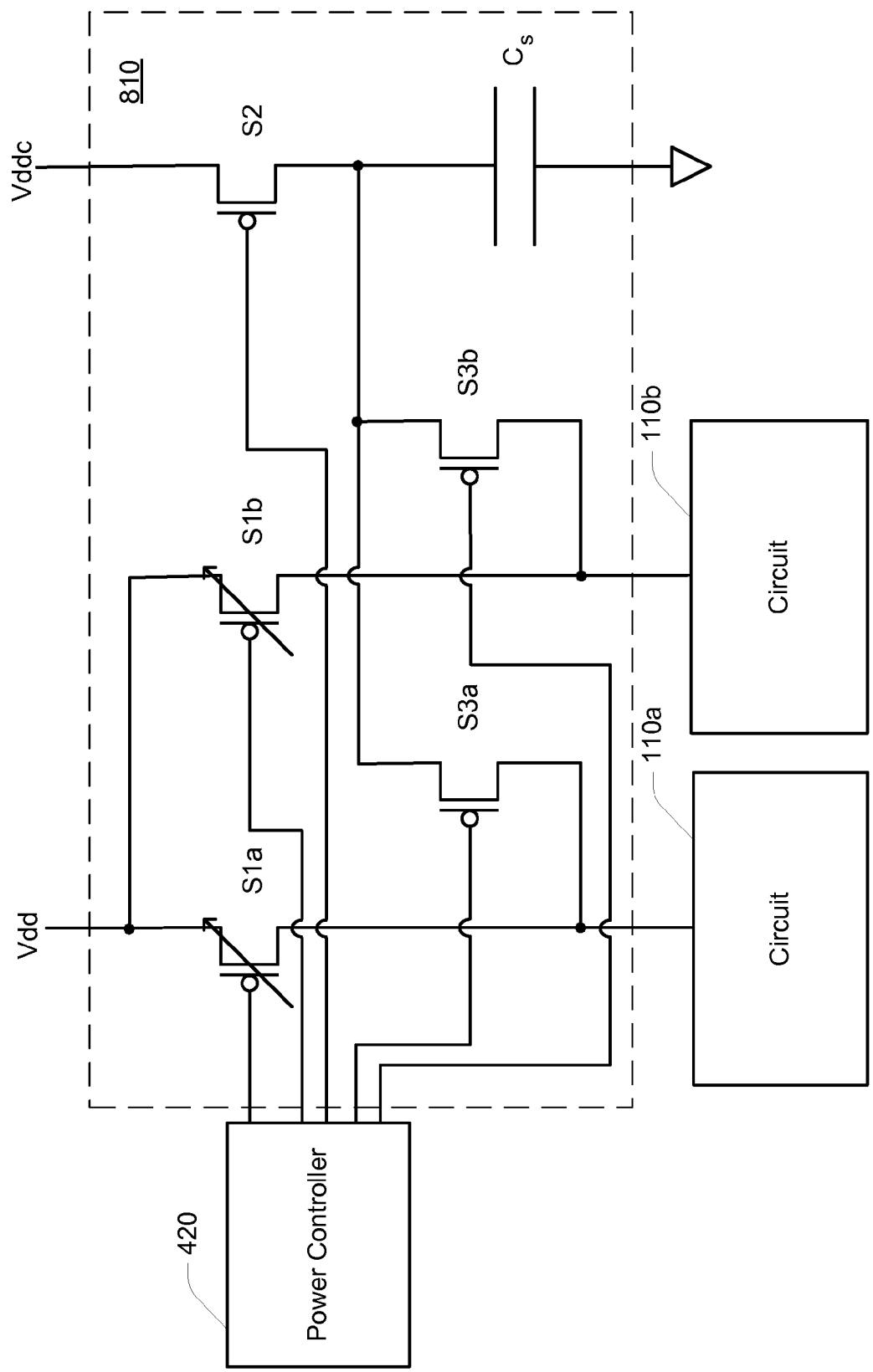
FIG. 8 illustrates an example power system in which a storage capacitor is charged by a separate power supply according to aspects of the subject technology.

FIG. 8 illustrates an example power system 810 in which circuits 110a and 110b are selectively connected to a power supply having a voltage of Vdd by switches S1a and S1b, respectively. In this example, the storage capacitor $C_S$ is selectively connected to the separate power supply having a voltage of Vddc by switch S2. The voltage Vddc may be higher than power supply voltage Vdd so that the storage capacitor $C_S$ can be charged to a higher voltage. Switches S3a and S3b may be turned off when the storage capacitor $C_S$ is charging to isolate the storage capacitor from circuits 110a and 110b. Making Vddc higher than Vdd enables the storage capacitor $C_S$ to supply more current to circuit 110a or 110b and/or raise the voltage of circuit 110a or 110b to a higher voltage. In this example, when the storage capacitor $C_S$ is used to supply current to a memory, the storage capacitor $C_S$ is capable of raising the voltage of the memory to:

$$V = \frac{Vr \cdot Cm + Vddc \cdot Cs}{Cm + Cs} \quad (3)$$

Figure 9:
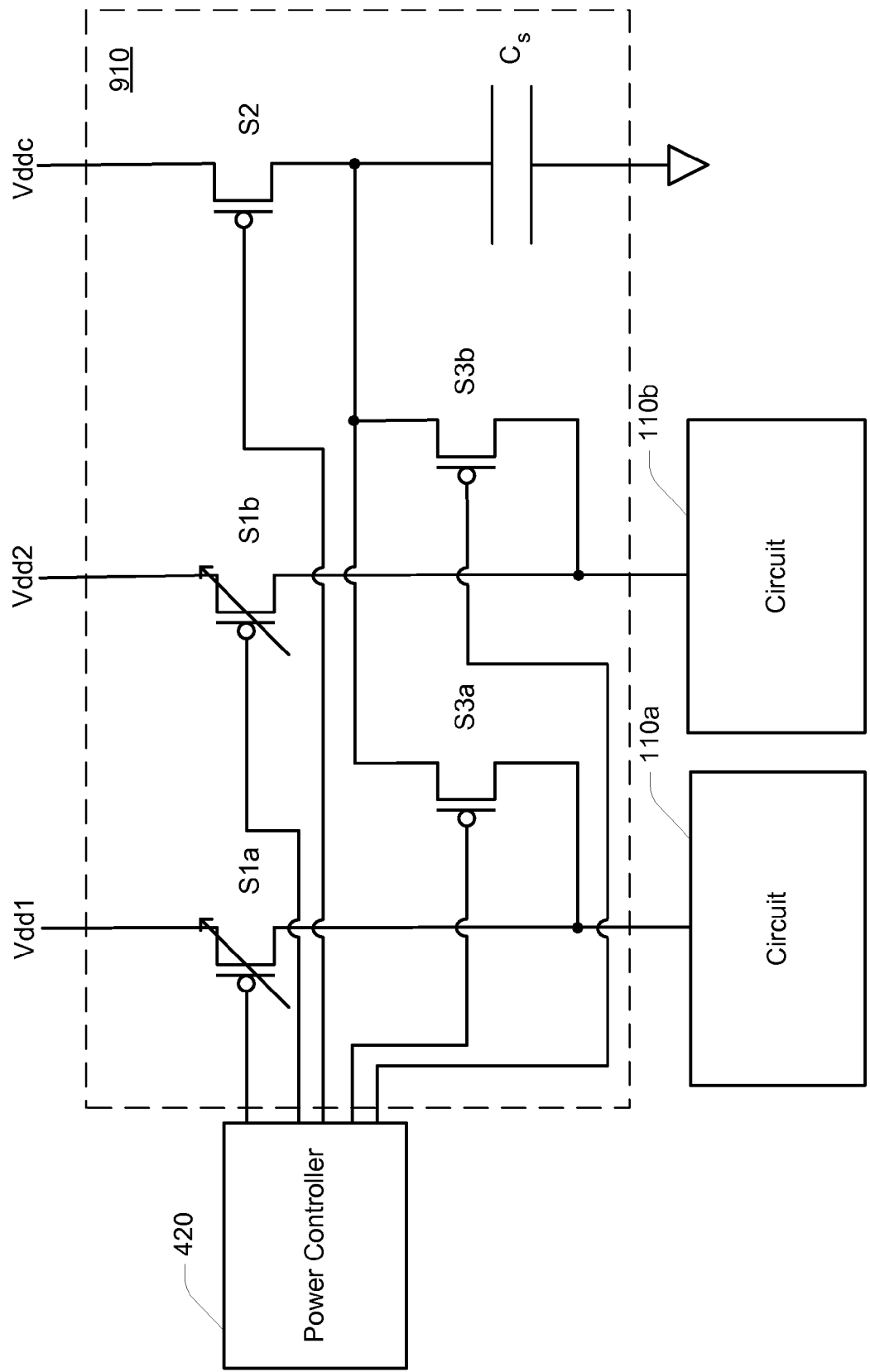
FIG. 9 illustrates another example power system according to aspects of the subject technology.

FIG. 9 illustrates an example power system 910 in which circuits 110a and 110b are selectively connected to different power supplies by switches S1a and S1b, respectively. Circuit 110a is selectively connected to a first power supply having a voltage of Vdd1, and circuit 110b is selectively connected to a second power supply having a voltage of Vdd2. Thus, circuits 110a and 110b may receive power at different power supply voltages (Vdd1 and Vdd2, respectively). The storage capacitor is selectively connected to a separate power supply having a voltage of Vddc by switch S2.

FIGS. 1-9 show examples in which each switch is implemented using a p-channel field effect transistor (PFET). A PFET switch may be turned off by applying a voltage of Vdd to the gate of the PFET switch, and may be turned on by lowering the voltage at the gate (e.g., to ground). It is to be appreciated that the subject technology is not limited to PFET switches, and that any suitable type of electronic switch may be used.

Figure 10:
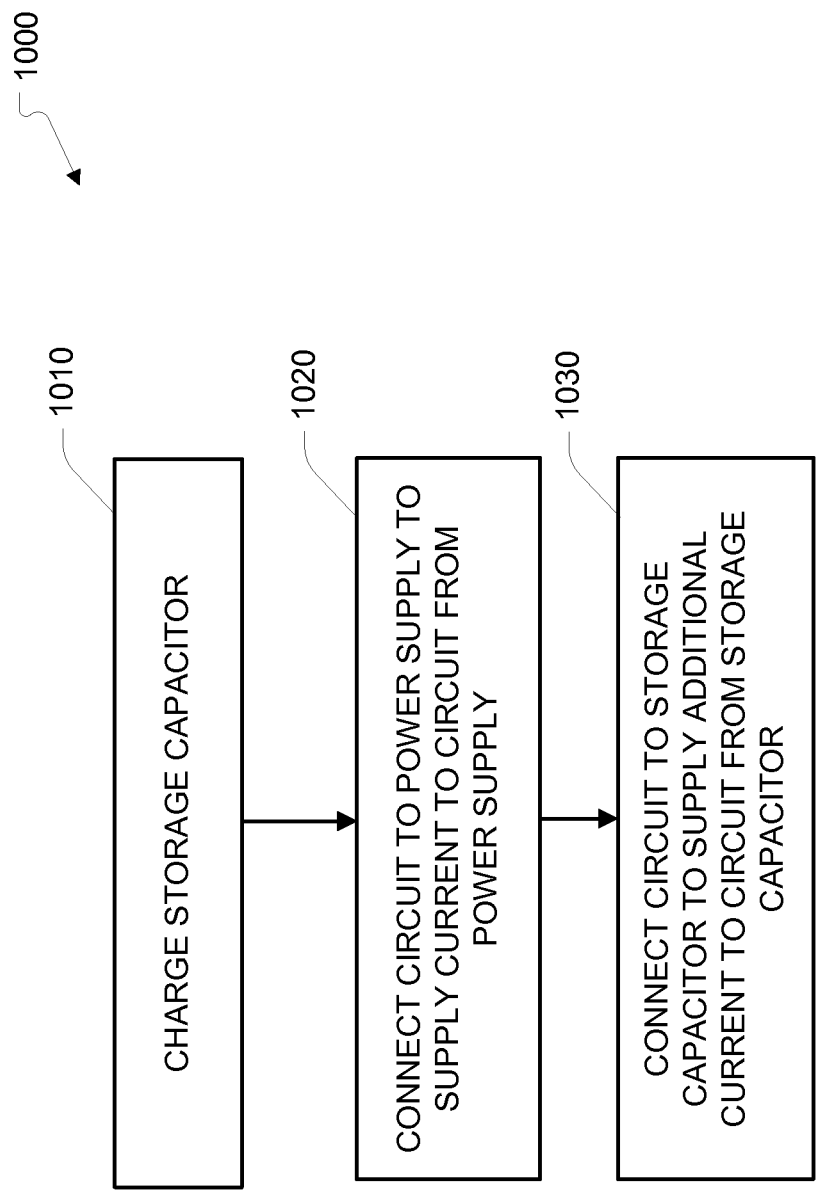
FIG. 10 is a flowchart illustrating an example method for managing power according to aspects of the subject technology.

FIG. 10 is a flowchart illustrating a method 1000 for power management according to some aspects of the subject technology. The method may be performed by the power controller 320 or 420.

A storage capacitor is charged (1010). A circuit to be powered up (e.g., from standby) is connected to a power supply to supply current to the circuit from the power supply (1020). The circuit is connected to the storage capacitor to supply additional current to the circuit from the storage capacitor (1030). As discussed above, the additional current supplied from the storage capacitor can be used to achieve a reduction in current surge through the power supply. The circuit may be connected to the power supply and the storage capacitor concurrently to supply current to the circuit simultaneously from the power supply and the storage capacitor.

For the example in which the storage capacitor is charged by connecting the storage capacitor to the power supply, the storage capacitor may be disconnected from the power supply at any time after the storage capacitor is charged (e.g., to the power supply voltage). In this example, the storage capacitor may be disconnected from the power supply just before the storage capacitor is connected to the circuit (1030).

When the circuit is connected to the power supply (1020), the circuit may be initially connected to the power supply through a variable-resistance switch in a high-resistance state to limit the current flow from the power supply. When the voltage of the circuit reaches a certain voltage level, the resistance of the switch may be reduced.

It is to be appreciated that the circuit may be connected to the storage capacitor (1030) before the circuit is connected to the power supply (1020).

In the disclosure, the storage capacitor $C_S$ may be connected to a "charge source" by switch S2 to charge the storage capacitor $C_S$. The charge source may be the power supply used to power circuit 110a, a separate power supply, or other source capable of charging the storage capacitor $C_S$. Thus, the subject technology is not limited to a particular type of charge source for charging the storage capacitor $C_S$.

The functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry.

Some implementations can include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

Some implementations can be performed by a microprocessor or multi-core processors that execute software. Some implementations can be performed by one or more integrated circuits, such as application specific integrated circuits (ASICs) or field programmable gate arrays (FPGAs). In some implementations, such integrated circuits can execute instructions that are stored on the circuit itself.

Many of the above-described features and applications may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A power system, comprising:
a power switch configured to selectively connect a circuit to a power supply;
a storage capacitor;
a first capacitor switch configured to selectively connect the storage capacitor directly to a charge source;
a second capacitor switch configured to selectively connect the storage capacitor directly to the circuit; and
a power controller configured to turn on the first capacitor switch to charge the storage capacitor from the charge source, to turn off the first capacitor switch after the storage capacitor is charged, and, when the circuit is to be powered up, to turn on the power switch and the second capacitor switch to supply current to the circuit from the power supply and the storage capacitor, respectively, wherein the power controller is configured to turn off the second capacitor switch when an adjustable resistance of the power switch is set to a second resistance, being lower than a first resistance, after a time delay following an initial powering up of the circuit.

2. The power system of claim 1, wherein the power controller is configured to initially set the resistance of the power switch to the first resistance when the circuit is to be powered up, and, after the time delay, to set the resistance of the power switch to the second resistance.

3. The power system of claim 2, wherein the power switch comprises:
   a first switch; and
   a second switch, the second switch having a lower resistance than the first switch;
wherein the power controller is configured to set the resistance of the power switch to the first resistance by turning on the first switch, and to set the resistance of the power switch to the second resistance by turning on the second switch.

4. The power system of claim 1, wherein, when the circuit is to be turned off or placed in a standby mode, the power controller is configured to turn off the power switch.

5. The power system of claim 1, wherein the charge source is the power supply.

6. The power system of claim 1, wherein the circuit comprises a memory, and the circuit is to be powered up from a memory retention voltage to a voltage of the power supply, the memory retention voltage being lower than the voltage of the power supply.

7. A method for managing power to a circuit, comprising:
charging a storage capacitor;
when the circuit is to be powered up, performing the steps of:
   directly connecting, by turning on a power switch, the circuit to the power supply to supply current to the circuit from the power supply;
   directly connecting, by turning on a capacitor switch, the circuit to the storage capacitor to supply current to the circuit from the storage capacitor;
   disconnecting the storage capacitor from the circuit when an adjustable resistance of the power switch is set to a second resistance, being lower than a first resistance, after a time delay following an initial powering up of the circuit.

8. The method of claim 7, further comprising:
initially setting the resistance of the power switch to the first resistance when the circuit is to be powered up; and
after the time delay, setting the resistance of the power switch to the second resistance.

9. The method of claim 7, further comprising, when the circuit is to be turned off or placed in a standby mode, disconnecting the circuit from the power supply.

10. The method of claim 7, wherein charging the storage capacitor comprises connecting the storage capacitor to the power supply.

* * * * *